United States Patent [19]
Ichimura et al.

[11] Patent Number: 5,835,042
[45] Date of Patent: Nov. 10, 1998

[54] SIGNAL TRANSMISSION METHOD AND SIGNAL TRANSMISSION APPARATUS

[75] Inventors: Gen Ichimura, Tokyo; Masayoshi Noguchi, Chiba, both of Japan

[73] Assignee: Sony Corporation, Tokyo, Japan

[21] Appl. No.: 754,401

[22] Filed: Nov. 21, 1996

[30] Foreign Application Priority Data

Dec. 28, 1995 [JP] Japan .................................... 7-344149

[51] Int. Cl.$^6$ ..................................................... H03M 7/32
[52] U.S. Cl. ............................................ 341/143; 375/247
[58] Field of Search .................................. 341/143, 77, 72, 341/68, 69; 375/247, 254

[56] References Cited

U.S. PATENT DOCUMENTS 5,610,606  3/1997  Fukunaga et al. ..................... 341/143
5,627,499  5/1997  Gardner ................................. 332/101

FOREIGN PATENT DOCUMENTS 4-023543  1/1982  Japan ............................... H04I 27/22
63-190458  8/1988  Japan ............................... H04I 27/18

*Primary Examiner*—Brian K. Young
*Assistant Examiner*—Peguy JeanPierre
*Attorney, Agent, or Firm*—Jay H. Maioli

[57] ABSTRACT

A high-quality transmission apparatus for a 1-bit digital signal. The 1-bit digital signal is transmitted via a phase modulator arranged upstream of a transmission route and demodulated by a phase demodulator arranged downstream of the transmission route for suppressing the jitter caused by power source variations and radiation noise during transmission.

9 Claims, 12 Drawing Sheets

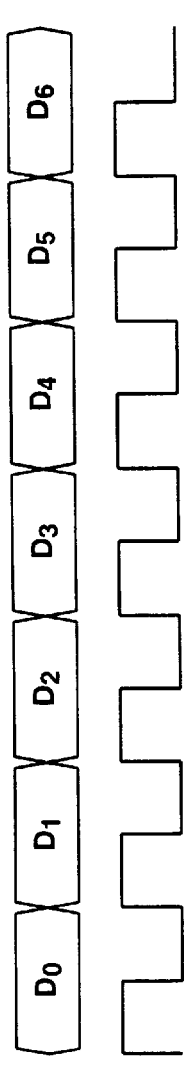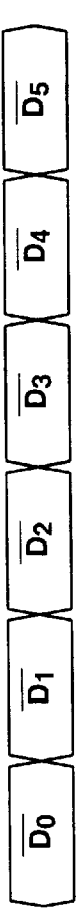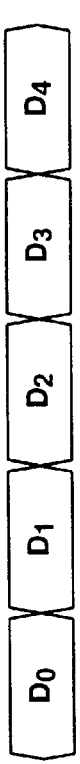
FIG.7A 1-BIT AUDIO SIGNAL INPUT $S_1$
FIG.7B 64Fs CLOCK $CK_1$
FIG.7C POSITIVE PHASE OUTPUT $S_2$ OF D-LATCH 5
FIG.7D NEGATIVE PHASE OUTPUT $S^*_2$ OF D-LATCH 5
FIG.7E PHASE MODULATION SIGNAL $S_5$
FIG.7F 128Fs CLOCK $CK_3$
FIG.7G 64Fs CLOCK $CK_2$
FIG.7H 1-BIT AUDIO SIGNAL OUTPUT $S_6$

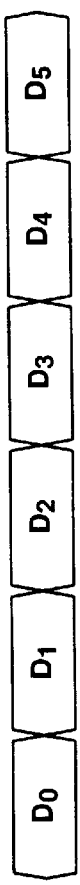
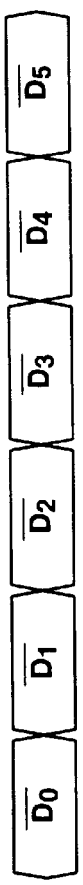
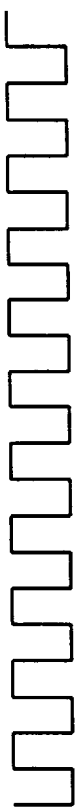
FIG.13A  $64F_s$ CLOCK $CK_1$
FIG.13B  POSITIVE OUTPUT $S_1$ OF ΣΔ MODULATOR 56
FIG.13C  INVERTED OUTPUT $S^*_1$ OF ΣΔ MODULATOR 58
FIG.13D  PHASE MODULATION SIGNAL $S_2$
FIG.13E  $128F_s$ CLOCK $CK'_3$
FIG.13F  $64F_s$ CLOCK $CK_2$
FIG.13G  1-BIT AUDIO SIGNAL OUTPUT $S_3$

SIGNAL TRANSMISSION METHOD AND SIGNAL TRANSMISSION APPARATUS

BACKGROUND OF THE INVENTION

1. Field of the Invention

This invention relates to a signal transmission method and apparatus for transmitting a ΣΔ modulated 1-bit signal.

2. Description of the Related Art

In general, for digitizing an audio signal, there is known a method for converting an analog audio signal into a multi-bit audio signal of, for example, a sampling frequency of 44.1 Khz and a data word length of 16 bits.

Besides this method, there has also recently been devised such a method consisting in digitizing an audio signal at a high frequency using a method termed sigma-delta (ΣΔ) modulation and directly converting the resulting 1-bit audio signal into analog audio signals.

The 1-bit digital data, obtained by this ΣΔ modulation, is represented by a sampling frequency significantly higher (such as 44.1 Khz times 64) and a data word length significantly shorter (such as 1 bit) than those of the data format hitherto used for conventional multi-bit audio signals (such as the sampling frequency of 64 Khz and the data word length of 16 bits) and characterized by a broad transmission frequency range. By this ΣΔ modulation, a high dynamic range can be secured in an audio range which is an extremely low frequency range as compared to the 64-tuple oversampling frequency. This feature can be exploited for data recording or transmission with high sound quality.

The ΣΔ modulation circuit itself is a known technique frequently used as a component of an A/D converter since the circuit structure can be easily designed as an IC lends itself easily to high-precision A/D conversion.

The ΣΔ modulated signal can be re-converted into an analog audio signal by being passed through a simple analog low-pass filter.

Meanwhile, the 1-bit audio signal, which is a pure digital signal of 1 and 0, can be restored into an analog audio signal by being passed through an analog low-pass filter. This indicates that the lower frequency components of the 1-bit audio signal are analog audio signal components per se.

FIG. 1 shows the results of an analysis of the spectral characteristics of an orchestra music up to 50 Khz. The analog audio signal components of the low frequency components of the 1-bit audio signal are now explained. In FIG. 1, the results of spectral analyses of the orchestra music up to 50 Khz are shown. The rise in signal level above 30 Khz is ascribable to noise shaping components produced at the time of ΣΔ modulation. The signal in a range lower than 30 Khz corresponds to analog audio signal components. This indicates that the low frequency components of a 1-bit audio signal obtained on ΣΔ modulation, which is a pure digital signal of 1 and 0, are analog audio signals.

Since analog audio signal components are contained in the transmitted 1-bit digital signal, power source fluctuations or radiation noise in the digital circuit resulting from transmission affect the transmitted 1-bit digital signal. For example, power source fluctuations modulate the transmitted 1-bit digital signal in the amplitude direction, as a result of which jitter variations strongly correlated with the analog audio components are produced to deteriorate the sound quality. Since the digital signal is discriminated with a pre-set threshold as a reference, small variations in amplitude due to power source fluctuations leads to changes in the timing of exceeding the above threshold value, thus producing jitter fluctuations.

In addition, the radiation noise ascribable to the digital circuit is mixed into the analog audio section with adverse effects. Since the analog audio signal components are contained in the radiation noise, the analog signal components contained in the 1-bit digital signal prior to digital-to-analog conversion affects the analog audio section by the radiation noise.

SUMMARY OF THE INVENTION

It is therefore an object of the present invention to provide a signal transmission method and apparatus in which analog audio signal components are suppressed at the time of transmission of the ΣΔ modulated 1-bit digital signals for enabling transmission of high-quality digital signals.

In one aspect, the present invention provides a signal transmission apparatus in which a 1-bit digital signal outputted by a ΣΔ modulator is transmitted over a transmission system. The signal transmission apparatus includes phase modulation means for phase-modulating the 1-bit digital signal outputted by the ΣΔ modulator for generating a phase-modulated signal which is sent to the transmission system, and phase demodulation means for demodulating the phase-modulated signal outputted by the transmission system, whereby the transmitted 1-bit digital signal may be prevented from being deteriorated due to power source variations and the radiation noise.

In another aspect, the present invention provides a signal transmission method in which a 1-bit digital signal outputted by a ΣΔ modulator is transmitted over a transmission system. The signal transmission method includes the steps of entering a phase-modulated signal obtained on phase modulation of the 1-bit digital signal outputted by the ΣΔ modulator to the transmission system and demodulating the phase-modulated signal outputted by the transmission system for preventing deterioration of the transmitted 1-bit digital signal due to power source variations or radiation noise.

With the signal transmission method and apparatus according to the present invention, since the 1-bit signal obtained on sigma-delta modulation is phase-modulated to give a phase-modulated signal, which is demodulated, analog audio signal components can be suppressed during transmission of sigma-delta modulated 1-bit digital signal, thus enabling high-quality transmission of the digital signal.

BRIEF DESCRIPTION OF THE DRAWINGS

FIG. 7A shows a 1-bit audio signal outputted by the ΣΔ modulator.

FIG. 7B shows a reference clock CK1 of a D-latch 5.

FIG. 7C shows a positive phase output signal S2 outputted by the D-latch 5.

FIG. 7D shows a positive phase output signal $S^*2$ outputted by the D-latch 5.

FIG. 7E shows an output S3 of the phase modulator 4.

FIG. 7F shows a reference clock CK3 of the phase demodulator 9.

FIG. 7G shows a reference clock CK2 of the phase demodulator 9.

FIG. 7H shows a 1-bit audio signal outputted by the phase demodulator 9.

FIG. 13A shows a reference clock CK1 given to a phase modulator 54.

FIG. 13B shows a positive phase output signal S1 of a ΣΔ modulator 56.

FIG. 13C shows a positive phase output signal $S^*1$ of the ΣΔ modulator 56.

FIG. 13D shows a phase modulated signal S2 outputted by the phase modulator 54.

FIG. 13E shows a reference clock CK3 given to the phase modulator 54.

FIG. 13F shows a reference clock CK2 given to the phase modulator 64.

FIG. 13G shows a 1-bit audio signal outputted by the phase demodulator 64.

DESCRIPTION OF THE PREFERRED EMBODIMENTS

Figure 2:
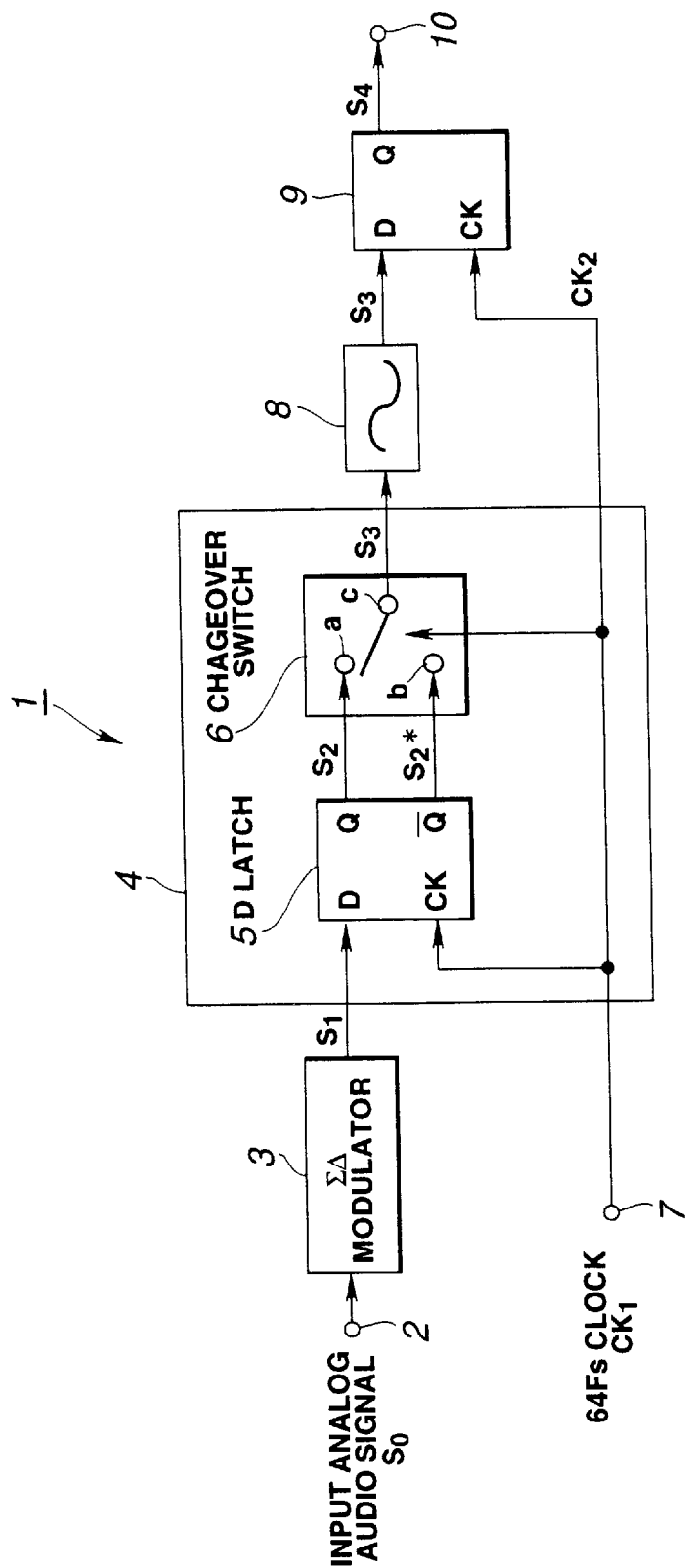
FIG. 2 shows a first embodiment of the present invention.
Figure 3:
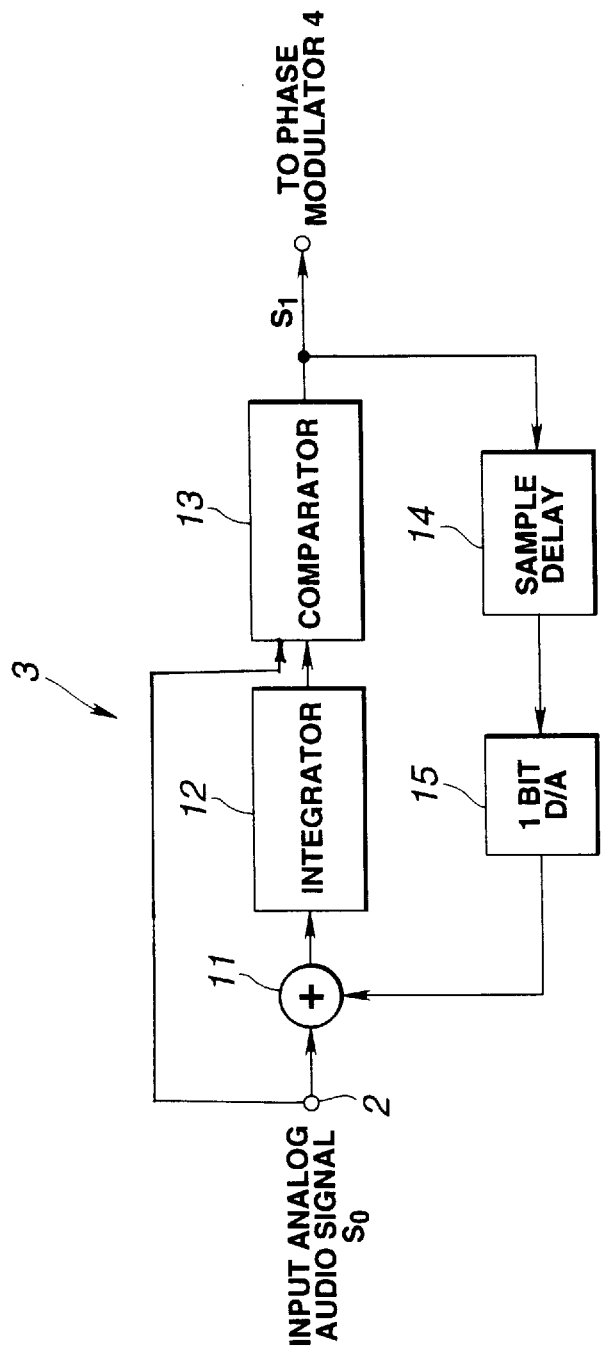
FIG. 3 is a block diagram of a ΣΔ modulator according to the present invention.
Figure 4:
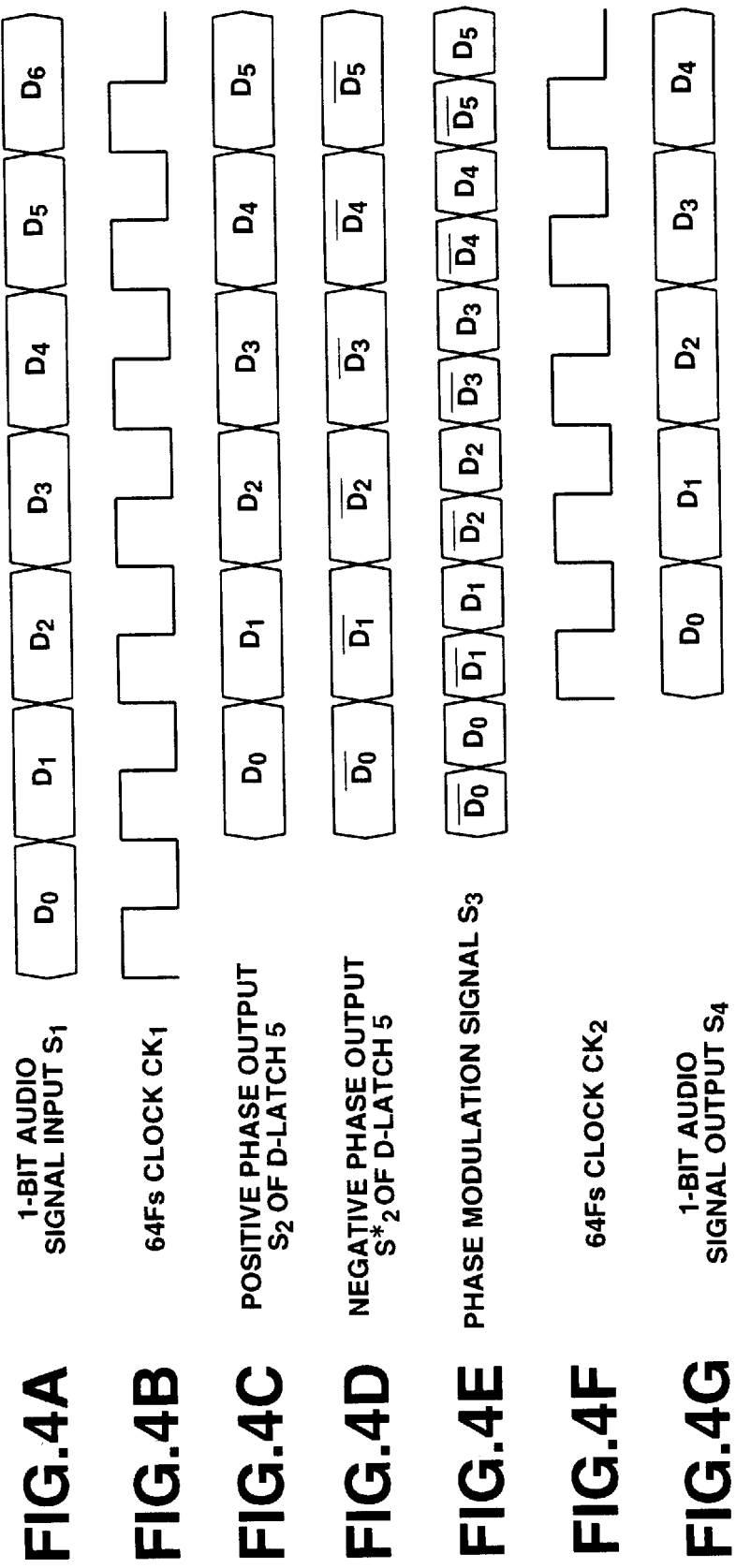
FIG. 4A shows a 1-bit audio signal outputted by the ΣΔ modulator.
FIG. 4B shows a reference clock CK1 of a D-latch 5.
FIG. 4C shows a positive phase output signal S2 outputted by the D-latch 5.
FIG. 4D shows a positive phase output signal $S^*2$ outputted by the D-latch 5.
FIG. 4E shows an output S3 of a phase modulator 4.
FIG. 4F shows a reference clock CK2 of a phase demodulator 9.
FIG. 4G shows a 1-bit audio signal outputted by the phase modulator 9.

Referring to FIGS. 2 to 4, a first embodiment of the present invention will be explained in detail. The first embodiment is directed to a 1-bit analog audio signal transmission device 1 for transmitting the 1-bit audio signal from ΣΔ modulation over a transmission route 8, as shown in FIG. 2. The 1-bit analog audio signal transmission device 1 includes a phase modulation unit 4 for phase modulating a 1-bit audio signal $S_1$ from the ΣΔ modulator 3 and a phase demodulator 9 for demodulating a phase-modulated signal $S_3$ from a phase modulator 4 transmitted over the transmission route 8.

The ΣΔ modulator 3 is configured as shown in FIG. 3. That is, an analog audio signal $S_0$ entering an input terminal 2 is fed via an adder 11 to an integrator 12. An integrated value from the integrator 12 is fed to a comparator 13 where it is compared to a neutral point potential of the analog audio signal $S_0$ and quantized with 1 bit at an interval of a sampling period so as to be outputted as a 1-bit audio signal $S_1$.

This 1-bit audio signal $S_1$ is fed to a one-sample delay unit 14 and thereby delayed by one sampling period. The delayed signal is fed to a one-bit D/A converter 15 where it is converted to an analog signal which is fed to the adder 11 and thereby summed to the analog audio signal $S_0$. The 1-bit audio signal $S_1$, outputted by the comparator 13, is sent to the phase modulator 4 shown in FIG. 2.

The phase modulator 4 is made up of a D-latch 5, comprised of a D-flipflop, and a changeover switch 6. The D-latch 5 is responsive to the clock $CK_1$ to output a positive-phase output $S_2$ and a reverse phase output $S^*_2$ of the 1-bit audio signal $S_1$. The clock $CK_1$ is of a clock rate equal to the transmission rate at the time of entrance of the 1-bit audio signal supplied from the clock input terminal 7. The changeover switch 6 is responsive to the clock $CK_1$ to alternately output the positive-phase output $S_2$ and a reverse phase output $S^*_2$ to generate the phase-modulated signal $S_3$.

The clock $CK_1$ is of a clock rate equal to 64 times the sampling frequency of 44.1 kHz (=Fs) employed in, for example, a compact disc. The clock $CK_1$ is termed herein as a 64 Fs clock. That is, if the transmission rate of the 1-bit audio signal $S_1$, outputted after ΣΔ modulation by the ΣΔ modulator 3, is 64 times Fs, the 1-bit audio signal $S_1$, entering the phase modulator 4 at the 64 Fs data rate, is latched by the D-latch 5 with, for example, the rising edge of the 64 Fs clock.

The phase demodulator 9 is also comprised of a D-latch, referred to hereinafter as a D-latch 9, and latches the phase modulated signal $S_3$ transmitted over the transmission route 8 with the rising edge of the 64 Fs clock transmitted from the phase modulator 4.

The operation of the above-described 1-bit analog audio signal transmission device 1 is now explained by referring to the timing chart shown in FIGS. 4A to 4G.

The 1-bit audio signal input $S_1$ from the ΣΔ modulator 3 is latched by the D-latch 5 with the rising edge of the 64 Fs clock $CK_1$ from the clock input terminal 7, as shown in FIG. 4B. The D-latch 5 sends the positive-phase output $S_2$ shown in FIG. 4C from the positive terminal Q to the fixed terminal a of the changeover switch 6, while sending the reverse-phase output $S^*_2$ shown in FIG. 4D from the inverting terminal $Q^*$ to the fixed terminal b of the changeover switch 6.

The changeover switch 6 switches a movable contact c to the fixed terminal a or to the fixed terminal b for alternately arraying a reverse-phase output $S^*_2$ or the positive-phase output $S_2$ of the D-latch 5 for the 64 FS clock $CK_1$ of 1 or 0, respectively, for generating the phase-modulated output $S_3$ shown in FIG. 4E.

It is possible with the phase-modulated signal $S_3$ to prevent deterioration of the signal quality due to jitter or radiation noise produced due to the low-frequency components of the positive-phase 1-bit audio signal acting as the analog audio signal component when only the positive-phase 1-bit audio signal is transmitted over the transmission route.

The phase modulation is such a modulation system in which the signal polarity is inverted in a rising direction and in a falling direction for data of "1" and "0", respectively. If the data rate after modulation is twice that before modulation, data "1" and data "0" are converted to 01 and 10, respectively. For the ΣΔ modulated 1-bit audio signal, this conversion is equivalent to delaying a signal reverse-phased relative to the 1-bit audio signal by one bit at the post-modulation bit rate and mixing the delayed signal to the 1-bit audio signal. The analog audio signal of a frequency sufficiently low for the data rate is canceled due to the reversed phase and suppressed sufficiently in signal level. With this phase modulation, data conversion may be reversed from the above-mentioned case, that is, data "1" and data "0" may be converted to 10 and 01, respectively.

The phase-modulated signal $S_3$ is supplied over the transmission route 8 to the D-latch 9 acting as the phase demodulator. The D-latch 9 can latch the phase-modulated signal $S_3$ with the rising edge of the 64 Fs clock for thereby latching only the 1-bit audio signal output equivalent to the positive phase output. The result is that the phase modulated signal has been phase-demodulated, that is the 1-bit audio signal output $S_4$, which is the same as the original 1-bit audio signal input $S_1$, can be outputted at the output terminal 10.

Figure 1:
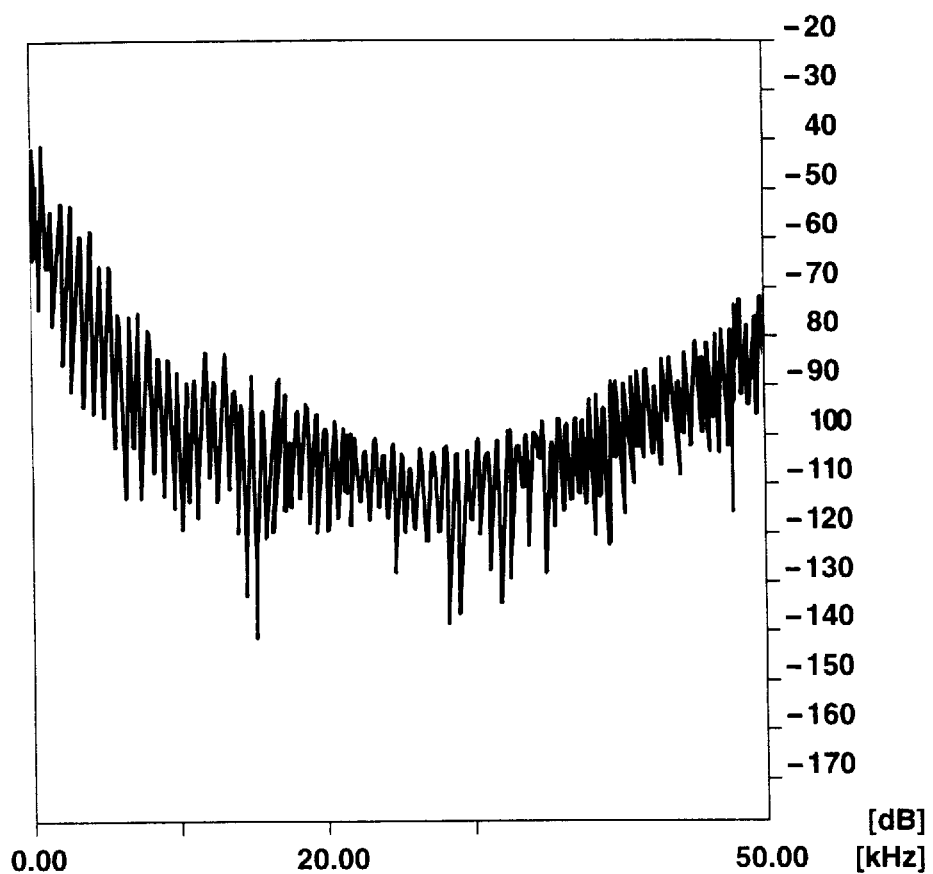
FIG. 1 shows spectral components of a pre-set audio signal.
Figure 5:
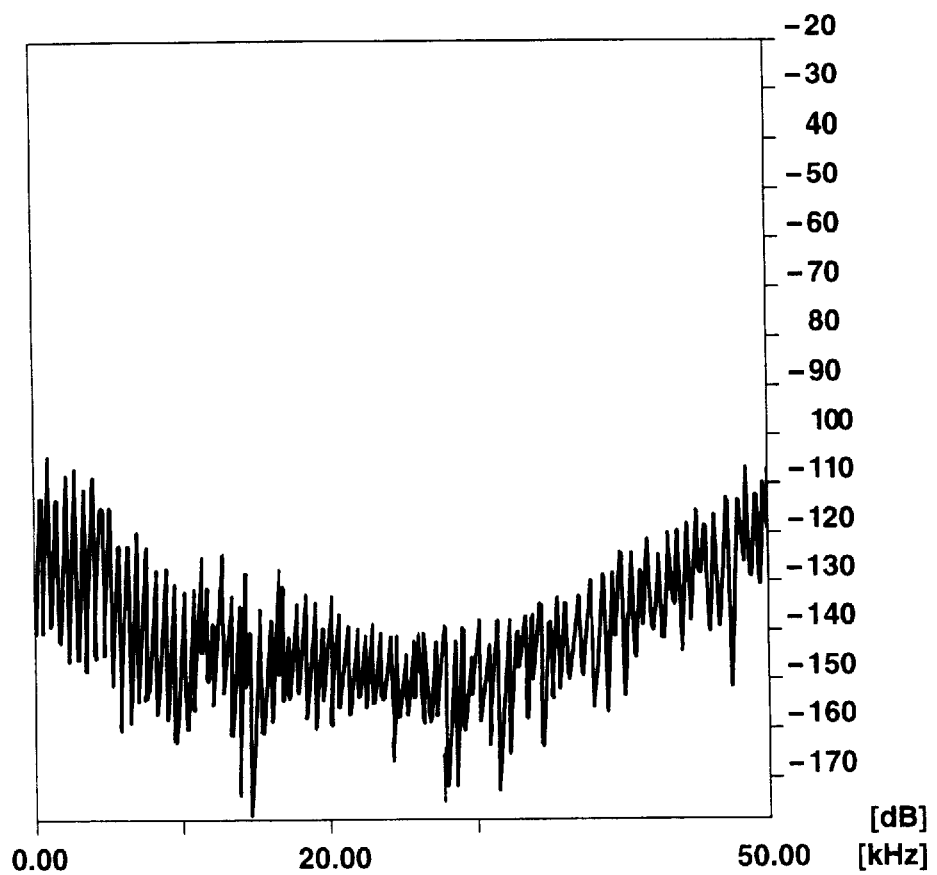
FIG. 5 shows spectral components of the same audio signals as that of FIG. 1 in the first embodiment of the present invention.

Referring to FIG. 5, the effect of the 1-bit analog audio signal transmission device 1 is explained. This figure shows the results of spectral analysis of the phase-modulated 1-bit audio signal. It is seen that, as compared from FIG. 1, the low-frequency components are canceled to a sufficiently lower level. Since the power source variations or the radiation noise of a digital circuit processing the phase-modulated 1-bit audio signal is correlated only weakly with the analog audio signal, the 1-bit audio signal can be transmitted with a high signal quality. In addition, the analog audio section is affected to the least extent possible.

Figure 6:
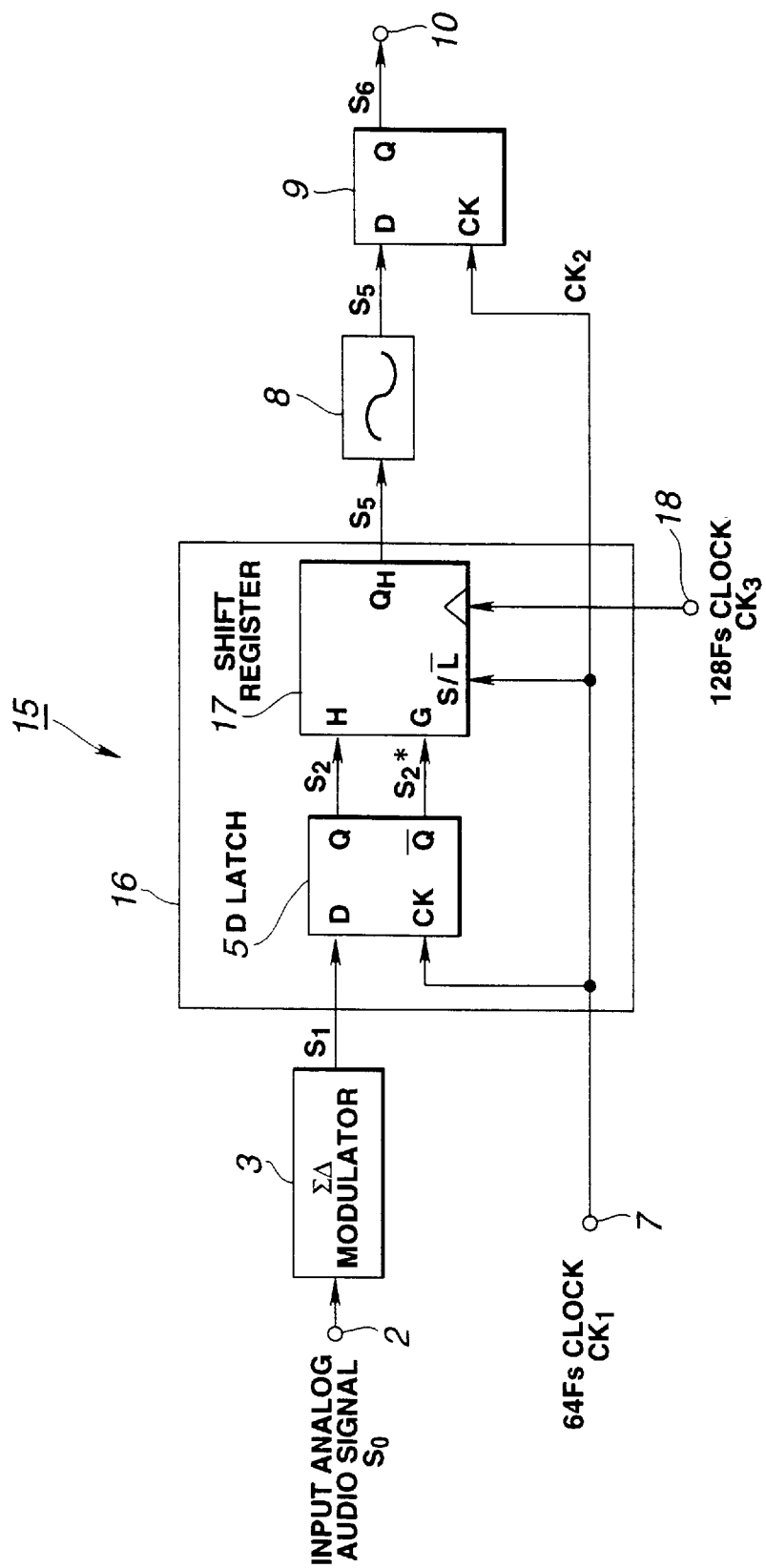
FIG. 6 shows a second embodiment of the present invention.

Referring to FIGS. 6 and 7, a second embodiment of the present invention is explained. This second embodiment is again directed to a 1-bit analog audio signal transmission device 15 for transmitting the 1-bit audio signal obtained on ΣΔ modulation over the transmission route. However, a phase modulator 16 of the present second embodiment differs from the phase modulator 4 of the 1-bit analog audio signal transmission device 1 of the first embodiment. In particular, the second embodiment differs from the first embodiment in that, in the phase modulator 16, a shift register 17 is used in place of the changeover switch 6.

The shift register 17 controls the loading and shifting of input data at the rate of the 64 Fs clock and sends the 1-bit audio signal $S_5$, phase-modulated with the 128 Fs clock $CK_3$, over the transmission route 8.

Since the shift register 17 is of the synchronous loading type, it loads the positive-phase output $S_2$ and the reverse-phase output $S^*_2$ of the D-latch 5 shown in FIGS. 7C and 7D from the input terminal H and the input terminal G with the rising edge of the 128 Fs clock $CK_3$ if the 64 Fs clock $CK_1$ is "1", while shifting the positive-phase output $S_2$ and the reverse-phase output $S^*_2$ with the rising edge of the 128 Fs clock $CK_3$ shown in FIG. 7F if the 64 Fs clock $CK_1$ is "0". This generates a phase-modulated signal $S_5$ shown in FIG. 7E.

A D-latch 9, operating as a phase demodulator, latches the phase-modulated signal $S_5$, transmitted over the transmission route 8, with the rising edge of the 64 Fs clock $CK_2$ shown in FIG. 7G, for outputting a 1-bit audio signal $S_6$, as a phase demodulated output, at the output terminal 10.

Thus it becomes possible with the present 1-bit audio signal transmission device 15 to prevent power source variations or radiation noise in the digital circuit to render it possible to transmit the 1-bit audio signal with high signal quality. In addition, the analog audio section is affected to the least extent possible.

In the 1-bit analog audio signal transmission device 15 of the present second embodiment, the phase-modulated signal $S_5$ is demodulated using the 64 Fs clock transmitted from the phase modulator 16 to the phase demodulator 9. It is however possible to extract the 64 Fs clock from the phase-modulated signal $S_5$ transmitted over the transmission route 8, using a clock auto-extraction circuit 19 shown in FIG. 8, and to demodulate the phase modulated signal $S_5$ using this 64 Fs clock $CK_2$.

The clock auto-extraction circuit 19 provides means for extracting bit clock components from the phase modulated signal $S_5$ for locking a PLL for bit synchronization, and has so far been used in, for example, a magnetic tape (MT) device or an electronic computer.

In a conventional multi-bit audio signal, digitally muted data are all-zero, such that, if the signal is phase-modulated, the resulting signal is of a pattern of alternately inverted "1"s and "0"s, that is a pattern 010101 . . . , which cannot be discriminated from 010101 . . . for all "1"s, such that data bit synchronization cannot be applied. Specifically, frequency synchronization with the 64 Fs clock $CK_2$ can be applied to the phase-modulated signal $S_5$, but phase synchronization cannot be applied, such that it cannot be discerned whether the data latched by the D-latch 9 is of the correct phase or of the reverse phase.

The 1-bit audio signal, handled in the present embodiment, is not such data in which "1"s or "0"s occur continuously for a prolonged time. In addition, digitally muted data are of a pattern of 101010 . . . or a pattern 10010110 . . . such that, if the data is phase-modulated, it is still possible to extract bit clock components and to apply data bit synchronization to the phase modulated signal. For example, if 10011 is phase modulated, a pattern 0110100101 is produced, in which the occurrence of two consecutive symbols indicates a transition point of the original data.

Figure 9:
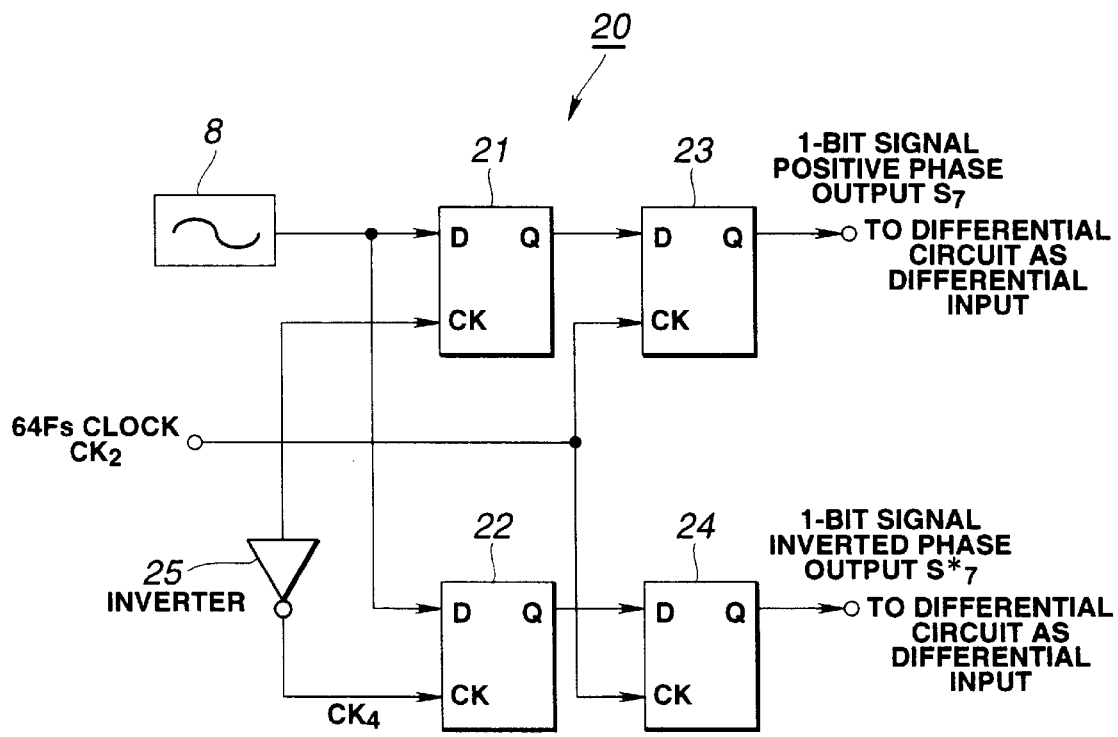
FIG. 9 is a block diagram showing the phase demodulator of the present invention.
Figure 10:
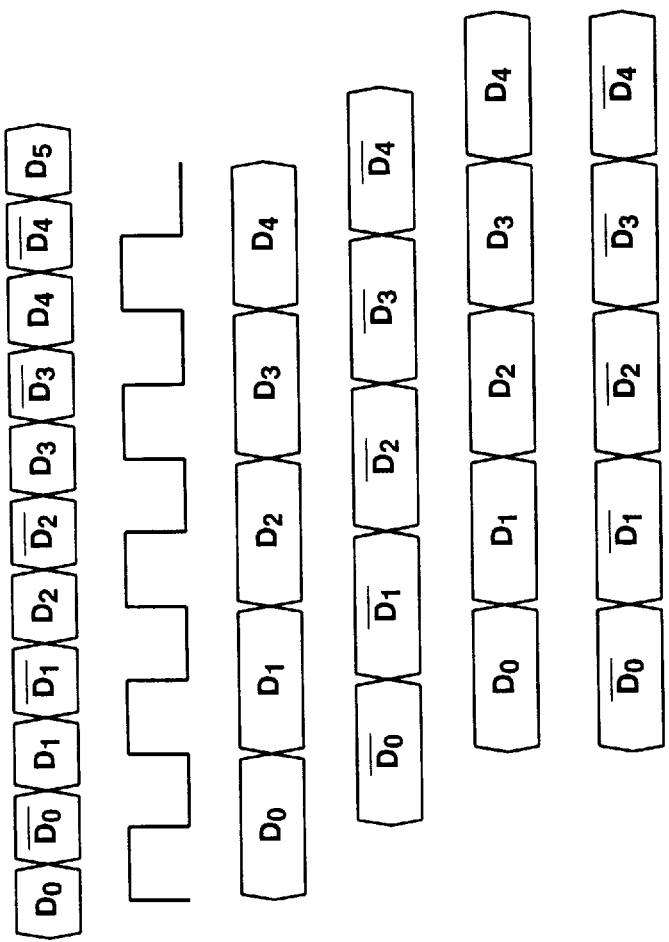
FIG. 10A is a block diagram of the phase modulation signal S5 transmitted over a transmission route.
FIG. 10B shows reference clock CK1 of D-latches 21, 23 and 24.
FIG. 10C shows an output signal outputted by the D-latch 21.
FIG. 10D shows an output signal outputted by the D-latch 22.
FIG. 10E shows a positive-phase output signal S7 outputted by the D-latch 23.
FIG. 10F shows a reverse-phase output signal $S^*7$ outputted by the D-latch 24.

As a modification of the 1-bit analog audio signal transmission device 15, such a 1-bit analog audio signal transmission device is possible in which, as shown in FIG. 9, the phase demodulator 9 is designed as a phase demodulator 20.

The phase demodulator 20 of the present modification corresponds to the phase demodulator 9 of FIG. 6 having a differential output. Referring to FIGS. 10A to 10F, the positive-phase portions of the phase-modulated signal $S_5$ transmitted over the transmission channel 8 are latched by the rising edges of the 64 Fs clock $CK_2$ by a D-latch 21. On the other hand, the reverse-phase portions of the phase-modulated signal $S_5$ are latched by a D-latch 22 with the falling edges of the 64 Fs clock $CK_4$ inverted by an inverter 25.

In addition, an output of the D-latch 21 corresponding to the above positive-phase portion is re-latched by a D-latch 23 with the rising edge of the 64 Fs clock $CK_2$, while an output of the D-latch 22 corresponding to the above reverse-phase portion is re-latched by a D-latch 24 with the rising edge of the 64 Fs clock $CK_2$, for timing synchronization. This generates a 1-bit positive-phase signal output $S_7$ and a 1-bit reverse-phase signal output $S^*_7$, shown in FIG. 10E and 10F, respectively.

Thus, by providing a differential amplifier, having the 1-bit positive-phase signal output $S_7$ and the 1-bit reverse-phase signal output $S^*_7$, downstream of the phase demodulator 20, it becomes possible to cancel out any extraneous noise occasionally present on the transmission channel 8.

Figure 11:
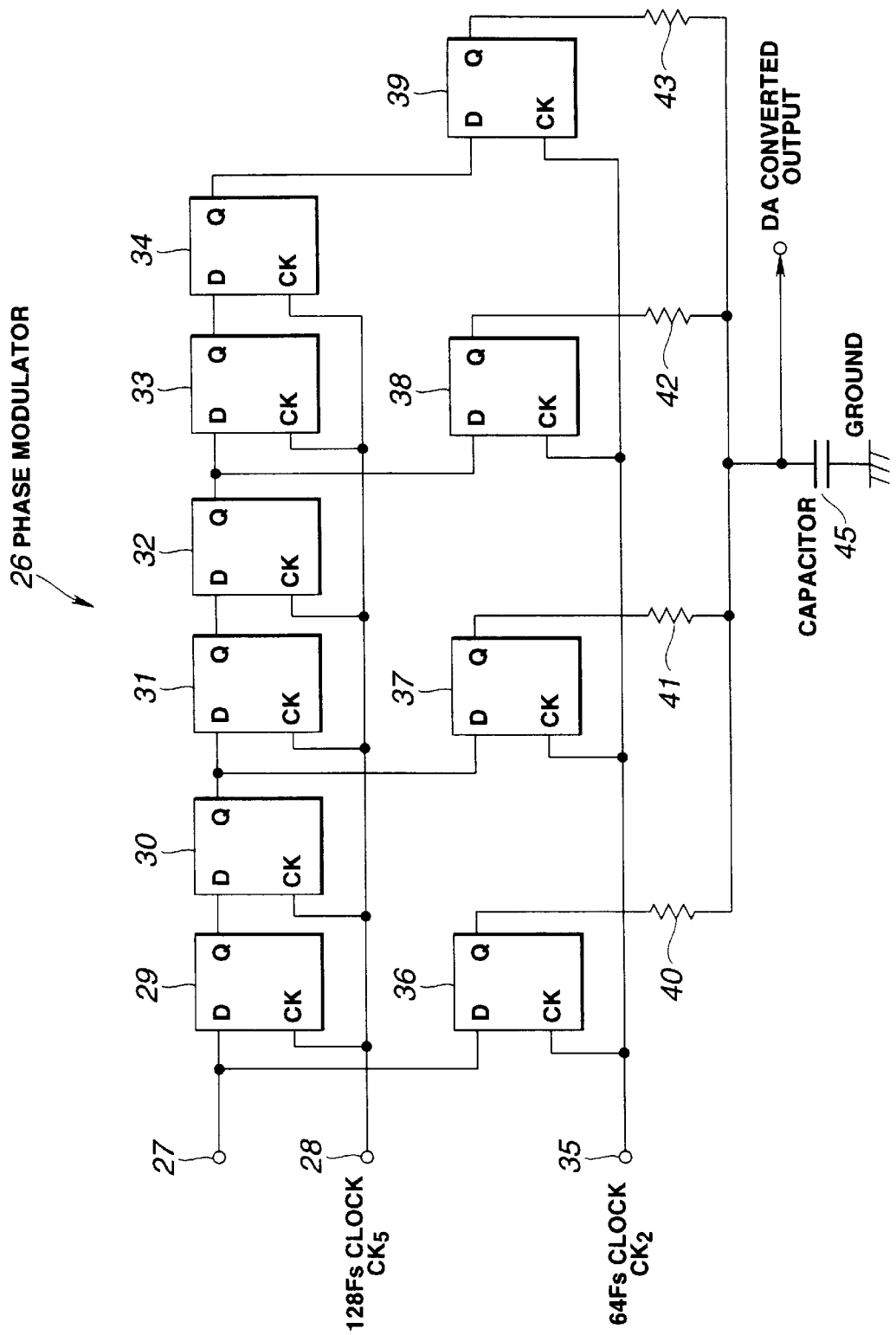
FIG. 11 is a block diagram showing another embodiment of the phase demodulator of the present invention.
Figure 12:
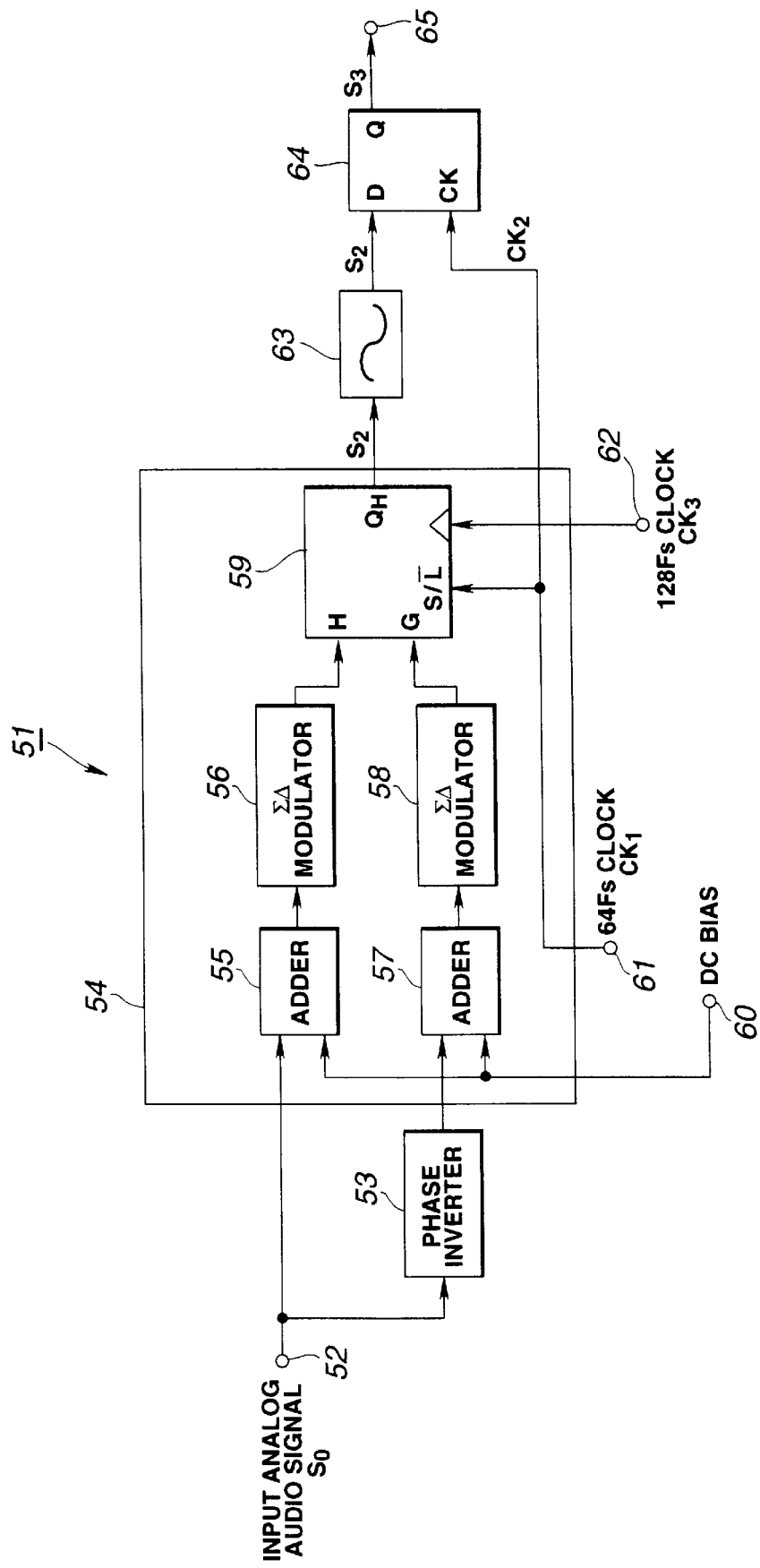
FIG. 12 is a block diagram showing another embodiment of a signal transmission device of the present invention.

As another modification of the 1-bit analog audio signal transmission device 15, such a 1-bit analog audio signal transmission device employing a phase demodulator 26 shown in FIG. 11 may also be envisaged.

In the phase demodulator 26 of the modification, the analog FIR filter simultaneously has the function of phase demodulation. The phase demodulator 26 is used simultaneously as a 4-tap analog FIR filter. The phase modulated signal $S_5$, supplied from an input terminal 27, is shifted in D-latches 29, 30, 31, 32, 33 and 34 in a timed relation to 128 Fs clock $CK_5$ supplied from a clock input terminal 28. The phase-modulated signal $S_5$ is latched by the D-latch 36 with the 64 Fs clocks $CK_2$, while outputs of the D-latches 30, 32 and 34 are latched by the D-latches 37, 38 and 39 with the 64 Fs clock $CK_2$, for phase demodulation. The phase-demodulated output is D/A converted by resistors 41, 43 and 44 and by a capacitor 45.

With the phase demodulator 26, since the phase modulated signal $S_5$ is phase-demodulated directly ahead of the D/A converter, a high-quality D/A converted output can be derived.

It is also possible to provide error detection means for detecting an error contained in 1-bit data, as used in a signal processing apparatus disclosed in Japanese Patent Laid-Open HEI 7-313346 by the present Assignee, and hold signal generating means for holding an output of the FIR filter during the period of error generation based on an error detected by the error detection means and for generating a delayed signal after error recovery, upstream of the phase demodulator 26, in order to inhibit the shift operation of the FIR filter during the period of generation of the hold signal, by way of holding a previous value. The phase demodulator 26 may also be applied to the difference output type phase demodulator shown in FIG. 9.

Referring to FIGS. 12 and 13A to 13G, a third embodiment of the present invention is explained. The present third embodiment is directed to a 1-bit audio signal transmitting device 51 for transmitting a 1-bit audio signal obtained by ΣΔ modulation through a transmission system, and includes a modulator 54 and a demodulator 64 for demodulating a demodulated signal $S_2$ supplied thereto from the modulator 54 through the transmission system 63. The modulated signal $S_2$ is generated in the modulator 54 by supplying an analog audio signal and a phase-inverted analog audio signal to two ΣΔ modulators 56, 58 across which the same dc bias voltage is applied, and by alternately arraying two outputs of the ΣΔ modulators 56, 58, obtained on supplying an analog audio signal and a phase-inverted analog audio signal, to the ΣΔ modulators 56, 58, at a rate twice that used for ΣΔ modulation.

The modulator 54 includes a first adder 55 for applying a dc bias voltage to an input analog audio signal $S_0$ from an input terminal 52, and a second adder 57 for applying a dc bias voltage to a phase-inverted signal $S^*_0$ obtained on phase-inverting the input analog audio signal $S_0$ from the input terminal 52 by a phase inserter 53. The modulator 54 also includes the first ΣΔ modulator 56 for ΣΔ modulating the sum output of the first adder 55 and the second ΣΔ modulator 58 for ΣΔ modulating the sum output of the second adder 57. The modulator 54 further includes a shift register 59 for switching between the 1-bit audio data $S_1$ from the first ΣΔ modulator 56 and the 1-bit audio data $S^*_1$ from the second ΣΔ modulator 58 and for outputting the selected data.

Although not explained specifically, the ΣΔ modulators 56, 58 are configured as shown in FIG. 3.

The shift register 59 controls the loading and shifting of input data with 64 Fs clock $CK_1$ as shown in FIG. 13A, and sends out the modulated 1-bit audio signal $S_2$ with 128 Fs clock $CK_3$ shown in FIG. 13E. Similarly to the shift register 10, the shift register 59 is of the synchronous loading type, and hence loads the positive output $S_1$ from the ΣΔ modulator 56 and the reverse-phase output $S^*_1$ of the ΣΔ modulator 58 from the input terminal H and the input terminal G with the rising edges of the 128 Fs clock $CK_3$ from the clock input terminal 62, if the 64 Fs clock $CK_1$ from the input terminal 61 is "1", while shifting the positive output $S_1$ and the reverse-phase output $S^*_1$ shown in FIGS. 13B and 13C with the rising edges of the 128 Fs clock $CK_3$ if the 64 Fs clock $CK_1$ is "0".

The D-latch 64, operating as the demodulator, latches the phase-modulated signal $S_2$, sent over the transmission system 63, with the rising edge of the 64 Fs clock $CK_2$, for outputting a 1-bit audio signal $S_3$, as a demodulated output, shown in FIG. 13G, at an output terminal 65.

Thus, with the present 1-bit analog audio signal transmission device 51, power source fluctuations or radiation noise of the digital circuit can be prevented from occurring, thus enabling the 1-bit audio signals to be transmitted with a high quality. Moreover, the analog audio section is affected to the least extent possible.

Figure 8:
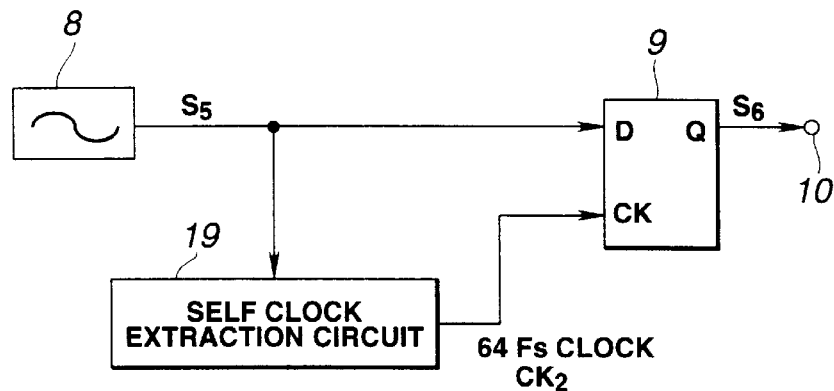
FIG. 8 is a block view for generating a reference clock of the phase demodulator of the present invention.

Although the 1-bit analog audio signal transmission device 51 of the present third embodiment uses a demodulator 64 constituted by a sole D-latch, the demodulator 20 shown in FIG. 8 may also be employed.

By providing a differential amplifier, having the 1-bit positive signal output $S_7$ and the 1-bit inverted signal output $S^*_7$ as the differential output, downstream of the demodulator 20, it is possible to cancel out extraneous noise occasionally mixed into the transmission system 63.

With the use of the demodulator 20, the dc bias voltage can be used for suppressing the noise due to the "tone" phenomenon produced in the ΣΔ modulator 56. Moreover, the dc bias voltage can be removed before demodulation to the analog audio signal, as will now be explained.

The first adder 55 and the second adder 57 applying the dc bias voltage supplied via voltage input terminal 60 to the input analog audio signal $S_0$ and to the phase inverted signal $S^*_0$ is also effective for avoiding the "tone" phenomenon generated in the next-stage ΣΔ modulator 56.

This "tone" phenomenon is such a phenomenon in which the idling noise is generated in the vicinity of "0" as disclosed in Robert C. Ledzius, "The Basis and Architecture for the Reduction of Tones in a Sigma-Delta DAC", IEEE Vol. 40, No. 7, July 1993. The noise by tones, which can be heard by the human ear as the noise in the audible range, is generated by forcibly converting the "0" input into one bit by the ΣΔ modulation circuit. Therefore, in reproducing the 1-bit digital data, containing the noise generated by the "tone" phenomenon, as an analog audio signal, such noise needs to be removed. For removing the noise, the above do bias voltage is applied to the analog audio signal $S_0$ as an input signal to the ΣΔ modulator 56.

However, this dc bias voltage needs to be removed when the 1-bit audio signal is reproduced as an analog audio signal. If this dc bias voltage is left, without being removed, an acute pulse-shaped noise is mixed in the analog audio signal converted on D/A conversion when the converted analog audio signal is transiently muted and subsequently unmuted. Moreover, if the analog audio signal having the dc bias content is continuously supplied to a speaker, the voice coil of the speaker is heated by the dc bias content, thus occasionally destructing the speaker.

The dc bias voltage can be removed by using a differential input of the 1-bit positive signal output $S_7$ and the 1-bit inverted signal output $S^*_7$.

What is claimed is:

1. A signal transmission apparatus in which a 1-bit digital signal output from a $\Sigma\Delta$ modulator is transmitted over a transmission system, the apparatus comprising:

phase modulation means for phase-modulating the 1-bit digital signal output from the $\Sigma\Delta$ modulator and generating a phase-modulated 1-bit signal for transmission over the transmission system;

means connected to the phase modulation means for providing a clock signal to the phase modulation means to establish a pre-set transmission rate equal to a transmission rate of the 1-bit digital signal output from the $\Sigma\Delta$ modulator; and phase demodulation means for demodulating the phase-modulated 1-bit signal output from the transmission system, wherein the 1-bit digital signal transmitted over the transmission system is prevented from being deteriorated due to power source variations and radiation noise.

2. The signal transmission apparatus as claimed in claim 1, wherein the phase modulation means outputs a positive-phase output and a reverse-phase output of the 1-bit digital signal based on the 1-bit digital signal output from the $\Sigma\Delta$ modulator, the positive-phase output and the reverse-phase output of the 1-bit digital signal being alternately output at a rate twice the pre-set transmission rate for generating the phase-modulated signal.

3. The signal transmission apparatus as claimed in claim 2, wherein the phase demodulation means demodulates the phase-modulated signal transmitted over the transmission system based on the pre-set transmission rate established by the clock signal.

4. The signal transmission apparatus as claimed in claim 3, wherein the pre-set transmission rate of the phase demodulation means is generated based on the clock signal extracted from the phase-modulated signal transmitted over the transmission system.

5. The signal transmission apparatus as claimed in claim 1, wherein the phase demodulation means demodulates a positive-phase output and a reverse-phase output of the 1-bit digital signal from the phase-modulated signal transmitted over the transmission system.

6. The signal transmission apparatus as claimed in claim 1, wherein the phase demodulation means demodulates the phase-modulated signal using an analog FIR filter.

7. A signal transmission method in which a 1-bit digital signal output from a $\Sigma\Delta$ modulator is transmitted over a transmission system, the method comprising the steps of:

phase modulating the 1-bit digital signal output from the $\Sigma\Delta$ modulator based on a clock signal which establishes a pre-set transmission rate equal to a transmission rate of the 1-bit digital signal output from the $\Sigma\Delta$ modulator;

transmitting the phase-modulated 1-bit signal obtained by phase modulation of the 1-bit digital signal output from the $\Sigma\Delta$ modulator over the transmission system; and demodulating the phase-modulated 1-bit signal output from the transmission system based on the pre-set transmission rate in order to prevent deterioration of the transmitted 1-bit digital signal due to at least one of power source variations and radiation noise.

8. A signal transmission apparatus in which a 1-bit digital signal output from a $\Sigma\Delta$ modulator is transmitted over a transmission system, the apparatus comprising:

means providing a clock signal for establishing a pre-set transmission rate;

a first D-latch for latching the 1-bit digital signal output from the $\Sigma\Delta$ modulator and generating a phase-modulated signal in response to the clock signal; and a second D-latch for latching the phase-modulated signal transmitted over the transmission system and generating the 1-bit digital signal in response to a rising edge of the clock signal, wherein pre-set transmission rate set by the clock signal is equal to a transmission rate of the 1-bit digital signal output from the $\Sigma\Delta$ modulator.

9. A signal transmission apparatus in which a 1-bit digital signal output from a $\Sigma\Delta$ modulator is transmitted over a transmission system, the apparatus comprising:

phase modulation means for phase-modulating the 1-bit digital signal output from the $\Sigma\Delta$ modulator and generating a phase-modulated 1-bit signal which is transmitted over the transmission system;

means connected to the phase modulation means for providing a clock signal to the phase modulation means to establish a pre-set transmission rate equal to a transmission rate of the 1-bit digital signal output from the $\Sigma\Delta$ modulator; and phase demodulation means for demodulating the phase-modulated 1-bit signal transmitted over the transmission system, the phase demodulation means including clock auto-extraction means for extracting clock components from the phase-modulated 1-bit signal for locking a phase-locked-loop for bit synchronization, wherein the 1-bit digital signal transmitted over the transmission system is prevented from being deteriorated due to power source variations and radiation noise.

* * * * *